United States Patent [19]

Mar et al.

[11] Patent Number: 5,532,636

[45] Date of Patent: Jul. 2, 1996

[54] SOURCE-SWITCHED CHARGE PUMP CIRCUIT

[75] Inventors: Monte F. Mar; Paul D. Madland, both of Beverton, Oreg.

[73] Assignee: Intel Corporation, Santa Clara, Calif.

[21] Appl. No.: 402,343

[22] Filed: Mar. 10, 1995

[51] Int. Cl.[6] .................................................. H03L 7/06
[52] U.S. Cl. ........................ 327/543; 327/157; 327/538
[58] Field of Search ........................................ 327/156, 157, 327/536, 537, 538, 543, 589

[56] References Cited

U.S. PATENT DOCUMENTS

| | | | |
|---|---|---|---|
| 4,633,488 | 12/1986 | Shaw | 327/157 |
| 5,144,156 | 9/1992 | Kawasaki | 327/157 |
| 5,182,529 | 1/1993 | Chern | 327/534 |
| 5,264,743 | 11/1993 | Nakagome et al. | 327/537 |
| 5,285,114 | 2/1994 | Atriss et al. | 327/157 |
| 5,362,990 | 11/1994 | Alvarex et al. | 327/156 |
| 5,376,848 | 12/1994 | Hanke, III et al. | 327/156 |
| 5,399,928 | 3/1995 | Lin et al. | 327/434 |

OTHER PUBLICATIONS

D. K. Jeong, G. Boriello, D. A. Hodges, and R. H. Katz, "Design of PLL-Based Clock Generation Circuits", IEEE Journal of Solid State Circuits, vol. SC-22, No. 2, Apr. 1987, pp. 255-261.

A. Waizman, "A Delay Line Loop for Frequency Synthesis of De-Skewed Clock", ISSCC Digest of Technical Papers, Fe. 1994, pp. 298-299.

M. G. Johnson and E. L. Hudson, "A Variable Delay Line PLL for CPU-Coprocessory Synchronization", IEEE Journal of Solid State Circuits, vol. 23, No. 5, Oct. 1988 pp. 1218-1223.

L. A. Young, J. K. Greason, and K. L. Wong, "A PLL Clock Generator with 5 to 110 MHz of Lock Range for Microprocessors", vol. 27, No. 11, Nov. 1992, pp. 1599-1606.

J. Alvarez, H. Sanchez, G. Gerosa, C. Hanke, R. Countryman and S. Thadasina, "A Wide-Bandwidth Low-Voltage PLL for PowerPC", Digest of Papers, Symposium on VLSI Circuits, Honolulu, Jun. 9-11, 1994.

*Primary Examiner*—Terry Cunningham
*Attorney, Agent, or Firm*—Blakely, Sokoloff, Taylor & Zafman

[57] ABSTRACT

A charge pump circuit suitable for use in a high frequency phase locked loop. The charge pump circuit comprises a biasing circuit, a charging transistor, a discharging transistor, and a pair of complementary switches. The charging transistor may be a p-channel field effect transistor (FET), and the discharging transistor may be a matched n-channel FET. The drains of the charging and discharging transistors are coupled together to form an output node for the charge pump circuit, and the biasing circuit provides a biasing voltage to the gates of the charging and discharging transistors. A first complementary switch is coupled in series between a supply voltage VCC and the source of the charging transistor. Similarly, a second complementary switch is coupled in series between system ground VSS and the source of the discharging transistor. A first pair of complementary control signals control the first complementary switch to switch on and off to provide positive current pulses at the output node, while a second pair of complementary control signals control the second complementary switch to switch on off to provide negative current pulses at the output node.

2 Claims, 7 Drawing Sheets

SOURCE-SWITCHED CHARGE PUMP CIRCUIT

FIELD OF THE INVENTION

The present invention relates generally to phase-locked loops and more specifically to charge pump circuits that may be used as components of phase-locked loops.

BACKGROUND OF THE INVENTION

Figure 1:
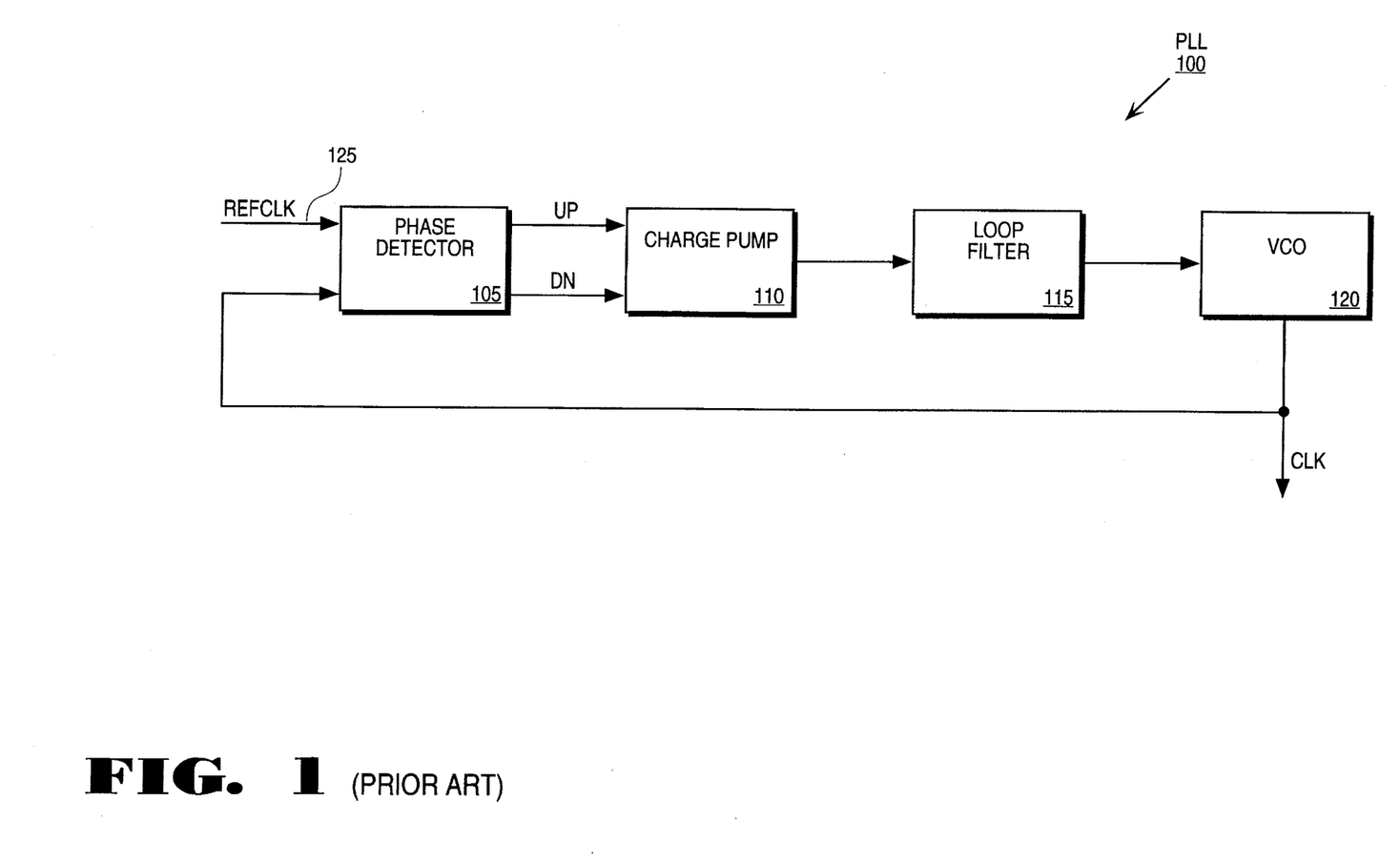
FIG. 1 shows a prior art phase-locked loop circuit.

FIG. 1 shows a prior art phase-locked loop (PLL) 100 as generally comprising a phase detector 105, a charge pump 110, a loop filter 115, and a voltage controlled oscillator (VCO) 120, all coupled in series. PLLs are often used in integrated circuits to internally generate clock signals with reference to an externally provided system clock signal.

In response to a voltage at its input, VCO 120 outputs an oscillating signal CLK that is the output signal of PLL 100. Typically, the frequency of the CLK signal tends to increase as the voltage at the input of VCO 120 increases. The CLK signal is fed back to the phase detector 105, which compares the phase of the CLK signal to the phase of a reference clock signal REFCLK having the desired lock frequency for the PLL 100. Phase detector 105 supplies voltage pulses in response to detecting phase differences between the CLK signal and the REFCLK signal. For example, when the frequency of the CLK signal is less than that of REFCLK, phase detector 105 supplies one or more "up" pulses to raise the voltage at the input of VCO 120. Conversely, when the frequency of the CLK signal is greater than that of REFCLK, phase detector 105 supplies one or more "down" pulses to lower the voltage at the input of VCO 120.

Charge pump 110 responds to voltage pulses by outputting current pulses that loop filter 115, which often includes a large capacitor, averages to define a DC voltage at the input of VCO 120. Charge pump 110 responds to up pulses by outputting "positive" current pulses that add charge to the capacitor of loop filter 115, raising the DC voltage at the input of VCO 120. Charge pump 110 responds to down pulses by outputting "negative" current pulses that remove charge from the capacitor of loop filter 115, lowering the DC voltage at the input of VCO 120. When the frequency of the CLK signal is equal to the frequency of REFCLK, PLL 100 is "in lock," and the DC voltage of loop filter 115 is essentially constant. Thus, when PLL 100 is in lock, loop filter 115 may be modeled as a DC voltage supply such as a battery.

Charge pump 110 is an important component of PLL 100 as charge pump 110 in many ways determines the maximum range of lock frequencies for PLL 100. Further, charge pump 110 may require a significant amount of semiconductor die space to implement and relatively high voltages to operate, thus increasing the overall size and power consumption of PLL 100.

Figure 2:
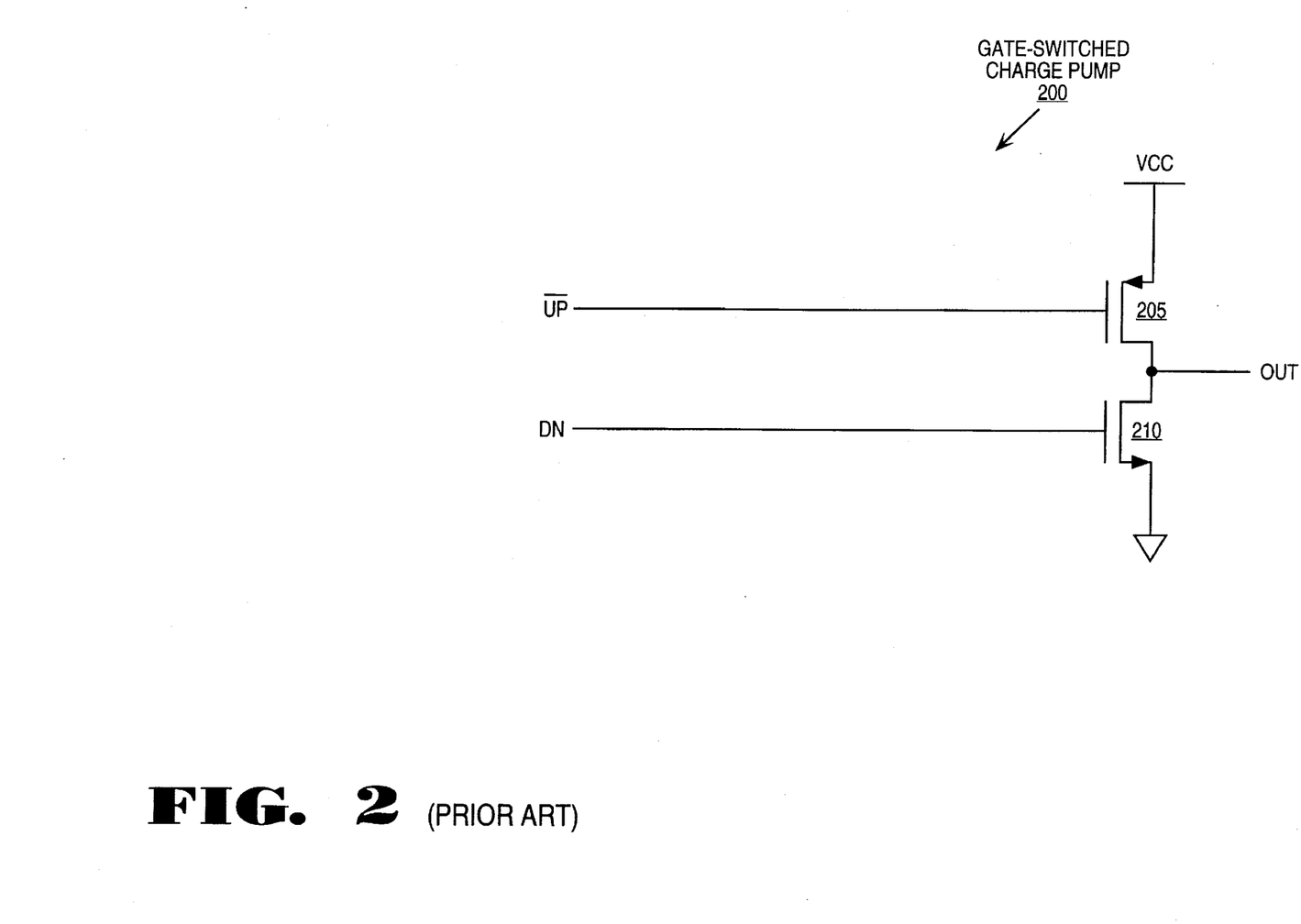
FIG. 2 shows a prior art gate-switched charge pump circuit.

FIG. 2 shows a prior art gate-switched charge pump circuit having a maximum lock frequency of approximately 150 MHz for current processing technology. Gate-switched charge pump circuit 200 includes a p-channel metal oxide semiconductor field effect transistor ("PMOS FET") 205 that acts as a "charging device" by supplying positive current pulses to the gate of FET 205 in response to an $\overline{\text{UP}}$ signal. Gate-switched charge pump circuit 200 also includes an n-channel metal oxide semiconductor ("NMOS") FET 210 that acts as a "discharging device" by supplying negative pulses to the gate of FET 210 in response to a DN signal. FETs 205 and 210 are typically sized such that a single positive current pulse adds as much charge to a capacitive load as a single negative current pulse removes from the capacitive load. Further, the current pulses are typically well-defined such that the amount of charge added or removed by a current pulse is known with some degree of certainty.

To produce well-defined current pulses at the output of a charge pump circuit, the edges of the control signals UP and DN must be sharp. For short current pulses the amount of time normally required to charge the gates of FETs 205 and 210 to switch on FETs 205 and 210 may become significant such that the amount of charge added or removed by current pulses can vary with perturbations in the ramp rate of the input signals. Therefore, for current pulses of relatively short duration, which may occur when the lock frequency of PLL 100 is above 150 MHz, gate-switched charge pump circuits may be undesirable.

Figure 3:
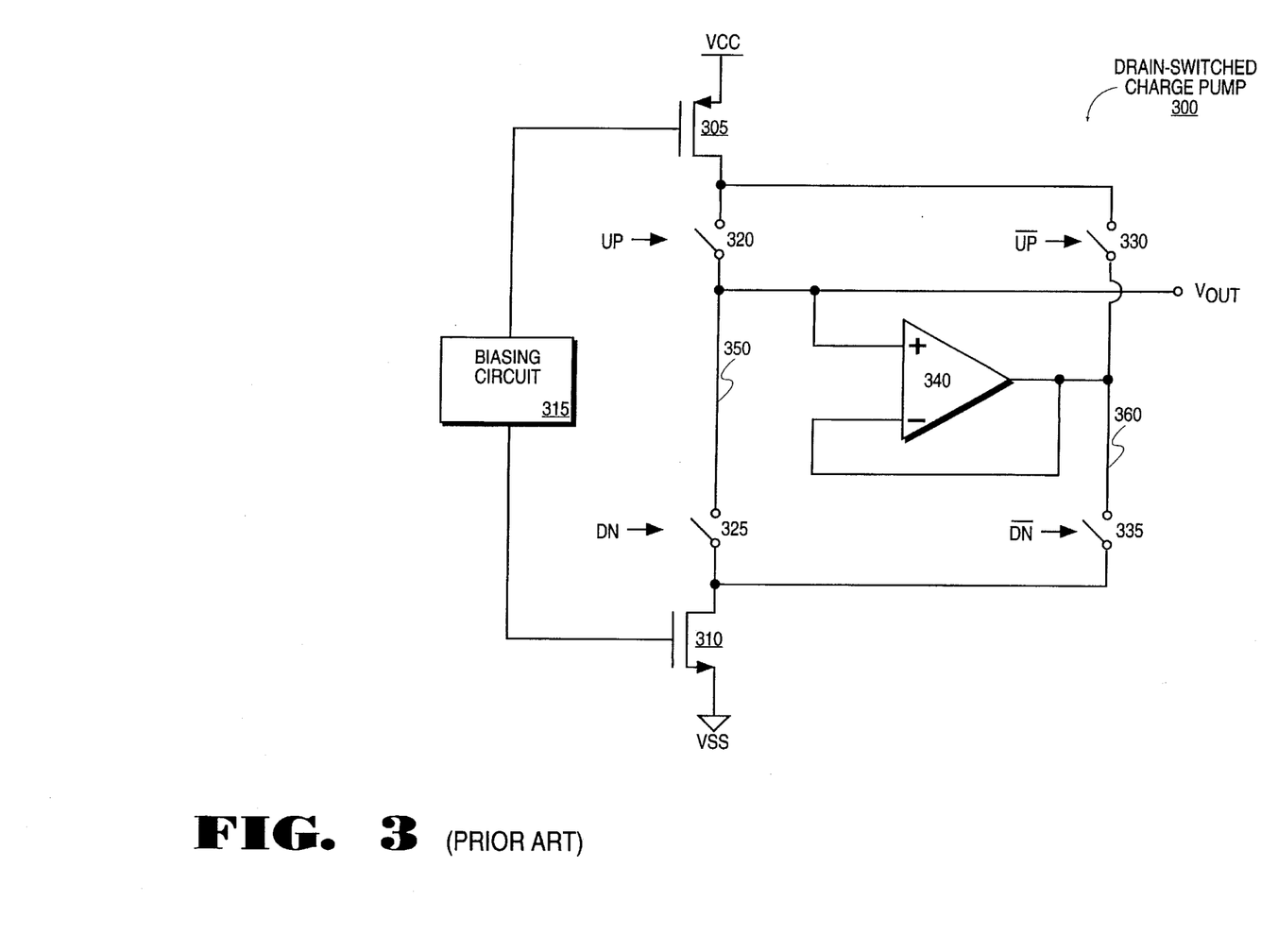
FIG. 3 shows a prior art drain-switched charge pump circuit.

FIG. 3 shows a prior art drain-switched charge pump circuit having a higher maximum lock frequency but requiring a relatively large amount of semiconductor die space to implement as well as high operating voltages. Drain-switched charge pump 300 includes charging transistor 305, discharging transistor 310, biasing circuit 315, switches 320–335, and operational amplifier 340. Biasing circuit 315 provides a biasing voltage to the gates of the charging transistor 305 and discharging transistor 310 such that the drain currents of the charging and discharging transistors are equal. Switches 320 and 330 are provided at the drain of charging device 305 to gate positive current pulses in response to signal pair UP and UP#. Similarly, switches 325 and 335 are provided at the drain of discharging device 310 to gate negative current pulses in response to complementary signal pair DN and DN#.

Drain-switched charge pump circuits may be used at higher frequencies than gate-switched charge pump circuits, but drain-switched charge pumps typically require the use of an operational amplifier, such as operational amplifier 340, which is used to maintain nodes 350 and 360 at the same voltage. Operational amplifiers typically require relatively large amounts of die space to implement, and operational amplifiers typically require relatively high value supply voltages. Therefore, the drain-switched charge pump 300 requires more semiconductor die space and increased power consumption when compared to gate-switched charge pumps.

SUMMARY AND OBJECTS OF THE INVENTION

Therefore, one object of the present invention is to provide a charge pump circuit that can operate at higher lock frequencies than a typical gate-switched charge pump.

Another object of the present invention is to provide a charge pump circuit that requires less semiconductor die space to implement than a typical drain-switched charge pump.

These and other objects of the invention are provided by a charge pump circuit that comprises a biasing circuit, a charging transistor, a discharging transistor, and a pair of complementary switches. The charging transistor may be a p-channel field effect transistor (FET), and the discharging transistor may be a matched n-channel FET. The drains of the charging and discharging transistors are coupled together to form an output node for the charge pump circuit, and the biasing circuit provides a biasing voltage to the gates of the charging and discharging transistors. A first complementary switch is coupled in series between a supply voltage VCC and the source of the charging transistor. Similarly, a second complementary switch is coupled in series between system ground VSS and the source of the discharging transistor. A first pair of complementary control signals control the first complementary switch to switch on and off to provide positive current pulses at the output node, while a second pair of complementary control signals control the second complementary switch to switch on off to provide negative current pulses at the output node.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 4:
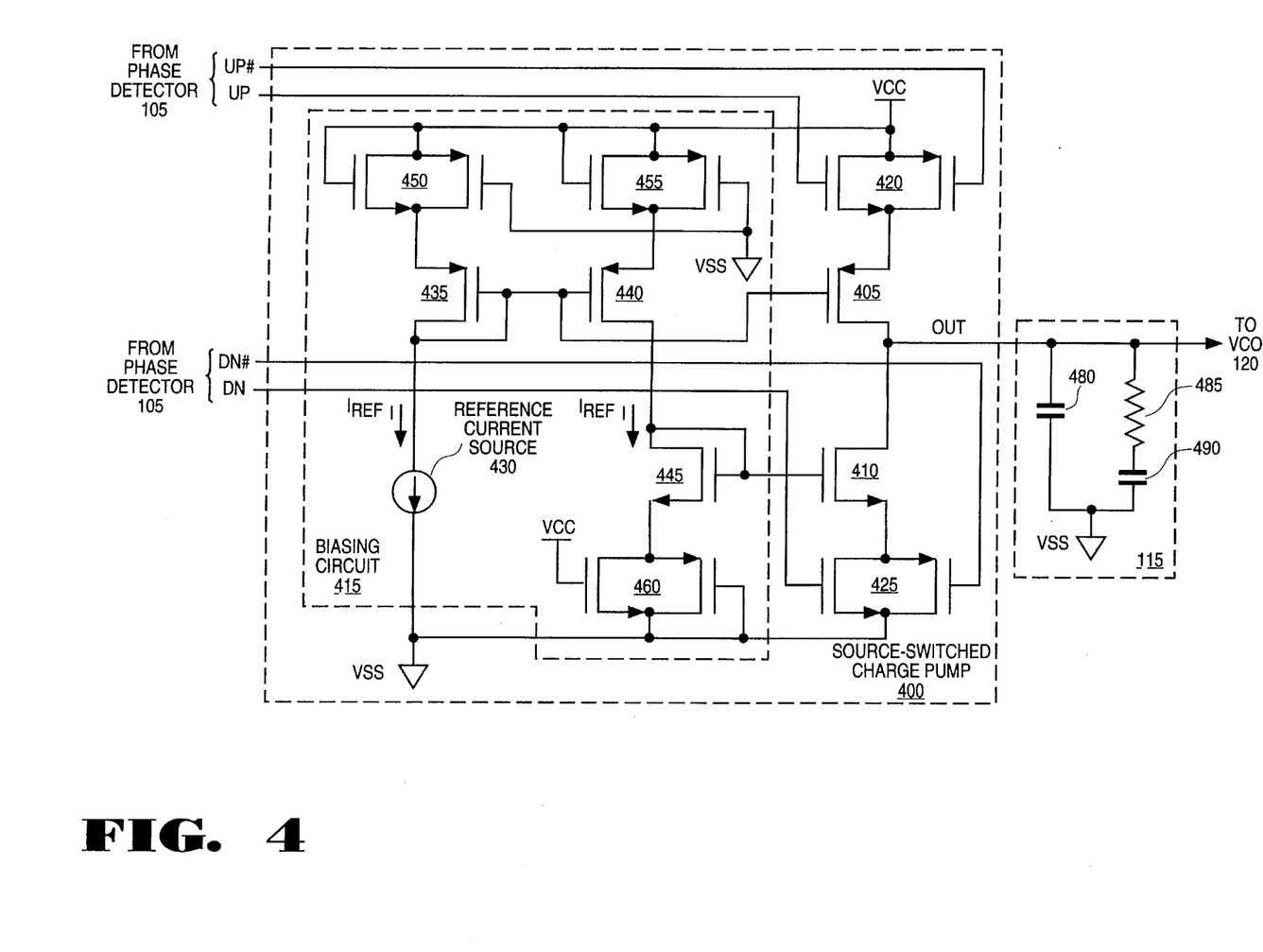
FIG. 4 shows a source-switched charge pump circuit according to one embodiment coupled to a loop filter.

FIG. 4 shows a source-switched charge pump 400 according to one embodiment coupled to a loop filter 115. Source-switched charge pump 400 provides higher frequency operation than can be reliably achieved by a typical gate-switched charge pump. Further, source-switched charge pump 400 requires less semiconductor die space, consumes less power, and may operate using lower operating voltages than a typical drain-switched charge pump.

While source-switched charge pump 400 may be used for any number of different applications, source-switched charge pump 400 has been designed for use as a component of a PLL, and there are number of considerations of PLL design that influence the design of a charge pump circuit such as source-switched charge pump 400. For example, the output voltage swing of a charge pump should ideally be able to go from the operating supply voltage VCC to system ground VSS because maximizing the output voltage swing typically increases the range of frequencies over which a PLL can operate. Further, a charge pump should ideally have a zero current offset over the entire range of operating frequencies for the PLL so that the same charge pump circuit may be used for every possible lock frequency of the PLL. Typically, non-zero current offset results in DC phase error, and if the current offset and DC phase error of a charge pump circuit are frequency dependent, the charge pump must be modified to operate correctly for different lock frequencies of the PLL.

Another consideration of charge pump design is the need to incrementally charge and discharge the capacitor of the loop filter in a controlled manner. Ideally, a positive current pulse ("charging pulse") and a negative current pulse ("discharging pulse") result in a positive charge packet and a negative charge packet, respectively, that are of equal magnitude such that one charging pulse adds as much charge to the capacitive load as a discharging pulse removes from the capacitive load. Further, the amount of charge contained in a charge packet is preferably constant such that the step size for charging and discharging the capacitor of the loop filter is known. DC phase error often results from charge packets that contain more less charge than expected.

Source-switched charge pump 400 generally comprises charging transistor 405, discharging transistor 410, biasing circuit 415, and complementary switches 420 and 425. Loop filter 115, which includes capacitor 480, resistor 485, and capacitor 490, is shown as being coupled to the output of source-switched charge pump 400.

Charging transistor 405 is shown as a PMOS field effect transistor (FET) having its gate coupled to an output of biasing circuit 415, its source coupled to complementary switch 420, and its drain coupled to the drain of discharging transistor 410. Discharging transistor 410 is shown as an NMOS FET having its gate coupled to an output of the biasing circuit 415 and its source coupled to complementary switch 425. The node defined by the drains of the charging and discharging transistors is the output of the source-switched charge pump 400. Both charging transistor 405 and discharging transistor 410 have body effect because the sources of the charging and discharging transistors are not tied to their respective supply rails.

Complementary switch 420 is switched on in response to an up pulse such that the source of charging transistor 405 is coupled to the operating supply voltage VCC, and current flows through the charging transistor 405 to charge capacitor 480 of loop filter 115. An up pulse occurs when the UP and UP# signal lines are logic high and logic low, respectively. Complementary switch 425 is switched on in response to a down pulse such that the source of discharging transistor 410 is coupled to system ground VSS, and current flows through the discharging transistor 410 to discharge the capacitance of loop filter 115. A down pulse occurs when the DN and DN# signal lines are logic high and logic low, respectively. Up and down pulses may be delivered by the phase detector circuit 105 shown in FIG. 1.

Complementary switches 420 and 425 each include a PMOS FET and an NMOS FET, wherein the source of the PMOS FET is coupled to the drain of the NMOS FET and the source of the NMOS FET is coupled to the drain of the PMOS FET. For the PMOS FET of a complementary switch, the channel width may be 1.52 μm, and the channel length may be 0.4 μm. For the NMOS FET of a complementary switch, the channel width may be 1.52 μm, and the channel length may be 0.4 μm. The voltage drop associated with a complementary switch having the exemplary values is approximately 150 millivolts.

The gate of the NMOS FET is coupled to the UP signal, while the gate of the PMOS FET is coupled to the complementary UP#. signal Complementary switch 425 has identical structure to the structure of the complementary switch 420, and the gate of the NMOS FET is coupled to the DN signal, while the gate of the PMOS FET is coupled to the DN# signal. An up pulse results in a positive current pulse, and a down pulse results in a negative current pulse.

The biasing currents at the gates of charging transistor 405 and discharging transistor 410, the duration of the up and down pulses, the relative size of the charging and discharging transistors 405 and 410, and the relative sizes of complementary switches 420 and 425 are selected such that a positive current pulse adds as much charge as a negative current pulse removes. Thus, the charge packets delivered by positive and negative current pulses are of equal magnitude.

Charging transistor 405 and discharging transistor 410 are perferably matched devices, but some mismatching may be required to tune source-switched charge pump to achieve a zero current offset. According to the present embodiment, charging transistor 405 has a channel width of 22 μm and a channel length of 1.04 μm, and discharging transistor 410 a channel width of 20 μm, and a channel length of 1.04 μm. Biasing circuit 415 delivers identical currents to the gates of the charging and discharging transistors such that the drain currents of charging transistor 405 and discharging transistor 410 are equal during up pulses and down pulses, respectively. Thus, if both the charging transistor 405 and the discharging transistor 410 are switched on, there will be no net output current to or from the loop filter 115.

In addition to being matched devices, charging transistor 405 and discharging transistor 410 are small devices that are approximately equal in size and that have relatively short channel lengths. As described below, using small matched charging and discharging transistors with short channel lengths reduces distortion effects at higher PLL lock frequencies that would otherwise result in a nonzero DC phase error at such frequencies. When sizing the charging and discharging transistors, it should be noted that matching of devices becomes more difficult when the size of the devices approaches the minimum feature size of the process technology, and the size of the charging and discharging transistors should be larger than the minimum feature size to improve the matching of the charging and discharging transistors.

To provide identical biasing of the charging and discharging transistors, the biasing circuit 415 is shown as a current mirroring arrangement that comprises a reference current source 430, PMOS FETS 435 and 440, NMOS FET 445, and complementary switches 450, 455, and 460. PMOS FETS 435 and 440 of the biasing circuit 415 have identical characteristics to charging transistor 405 such the drain current of charging transistor 405 is equal to the reference current $I_{REF}$ when complementary switch 420 is switched on. Similarly, NMOS FET 445 has identical characteristics to discharging transistor 410 such that the drain current of discharging transistor 410 is equal to the reference current $I_{REF}$ when complementary switch 425 is switched on.

Complementary switches 450 and 455 of biasing circuit 415 are always switched on, and each has identical characteristics to complementary switch 420 to match the voltage drop from the operating supply voltage VCC to the source of charging transistor 405 associated with complementary switch 420. By matching the voltage drop across the complementary switch 420 when the complementary switch 420 is switched on, one can better ensure that the drain current of charging transistor 405 is equal to the reference current $I_{REF}$. Similarly, complementary switch 460 of biasing circuit 415 is always switched on and has identical characteristics to complementary switch 425 to match the voltage drop from the source of discharging transistor 410 to system ground VSS associated with complementary switch 425. By matching the voltage drop across the complementary switch 425 when the complementary switch 425 is switched on, one can better ensure that the drain current of discharging transistor 410 is equal to the reference current $I_{REF}$.

The voltage drops associated with the complementary switches 420 and 425 reduce the output voltage swing of source-switched charge pump 400. The output voltage swing of the source-switched charged pump 400 may be increased by using larger complementary switches having smaller on-resistances that decrease the size of the associated voltage drops.

The output voltage swing of source-switched charge pump 400 is also limited by the saturation drain-source voltage $V_{DS(sat)405}$ of charging transistor 405 when the voltage at the output of source-switched charge pump approaches the operating supply voltage VCC. Similarly, the output voltage swing of source-switched charge pump 400 is limited by the saturation drain-source voltage $V_{DS(sat)410}$ of discharging transistor 410 when the voltage at the output of source-switched charge pump approaches the system ground VSS.

The voltage of the loop filter sets the voltage at the drains of the charging and discharging transistors 405 and 410. When the value of the loop filter voltage is driven closer the value of either the VCC supply rail or the VSS supply rail, the drain voltage of the transistor coupled to that supply rail is driven closer to the value of the supply rail, and the drain-source voltage VDS is reduced. If the voltage of the loop filter is driven too close to the value of a supply rail, the transistor coupled to that supply rail may enter the soft saturation region wherein there is a linear relationship between the drain current and the drain-source voltage $V_{DS}$, which may alter the effective output impedance of source-switched charge pump 400. For example, if the loop filter voltage is too close to the operating supply voltage VCC, charging transistor 405 may be driven to operate in the linear region, and the drain current of charging transistor 405 may no longer be equal to $I_{REF}$. Therefore, the output voltage swing is preferably limited to values that allow the charging and discharging transistors to operate in the saturation region to reduce the likelihood of DC phase error at the outer limits of the PLL lock frequency range.

Although the complementary switches 420 and 425 limit the output voltage swing of the source-switched charge pump 400 to a certain extent, the complementary switches 420 and 425 serve to reduce frequency-dependent current transients and thus the DC phase error for the PLL. For example, a gate-to-drain capacitance is typically associated with an FET. When the voltage at the gate of a FET is rapidly driven to a new value, the voltage at the gate may be capacitively coupled to the drain via the parasitic gate-to-drain capacitor. This effect is referred to as clock-feedthrough in switched capacitor circuits.

When the PLL is near lock, complementary switches 420 and 425 go on and off during each clock cycle. The charge injection due to clock-feedthrough is approximately fixed because the voltage swing at the sources of the charging and discharging transistors is typically small and fixed in value. By using the complementary CMOS switches 420 and 425, the clock feed-through charge is canceled to the first order. Thus, little or no net charge is injected into the output of the source-switched charge pump 400 by the action of switching complementary switches 420 and 425 on. If complementary switches were not used, the DC phase error of the PLL would tend to increase as the frequency increased because the relatively large currents which arise from switching the switch device on and off rapidly would result in a net output current.

When compared to drain-switched charge pumps, placing the complementary switches at the sources of the charging and discharging transistors reduces the effects of switch charge injection due to switching the complementary switches on and off. Switch charge injection is the phenomenon in which channel charge is dumped asymmetrically to the outputs of the switch depending on the voltages at the outputs of the switch. Because the voltages on both of the "outputs" of a complementary switch are fixed—the voltages of both supply rails are fixed, and the voltage at the sources of the charging and discharging transistors do not vary greatly—the current due to switch charge injection is fixed, and any resulting DC phase error is not frequency dependent. For drain-switched charge pumps, the amount of output current due to clock-feedthrough and switch charge injection may vary with the output voltage of the drain-switched charge pump, leading to frequency dependent phase errors.

Figure 5:
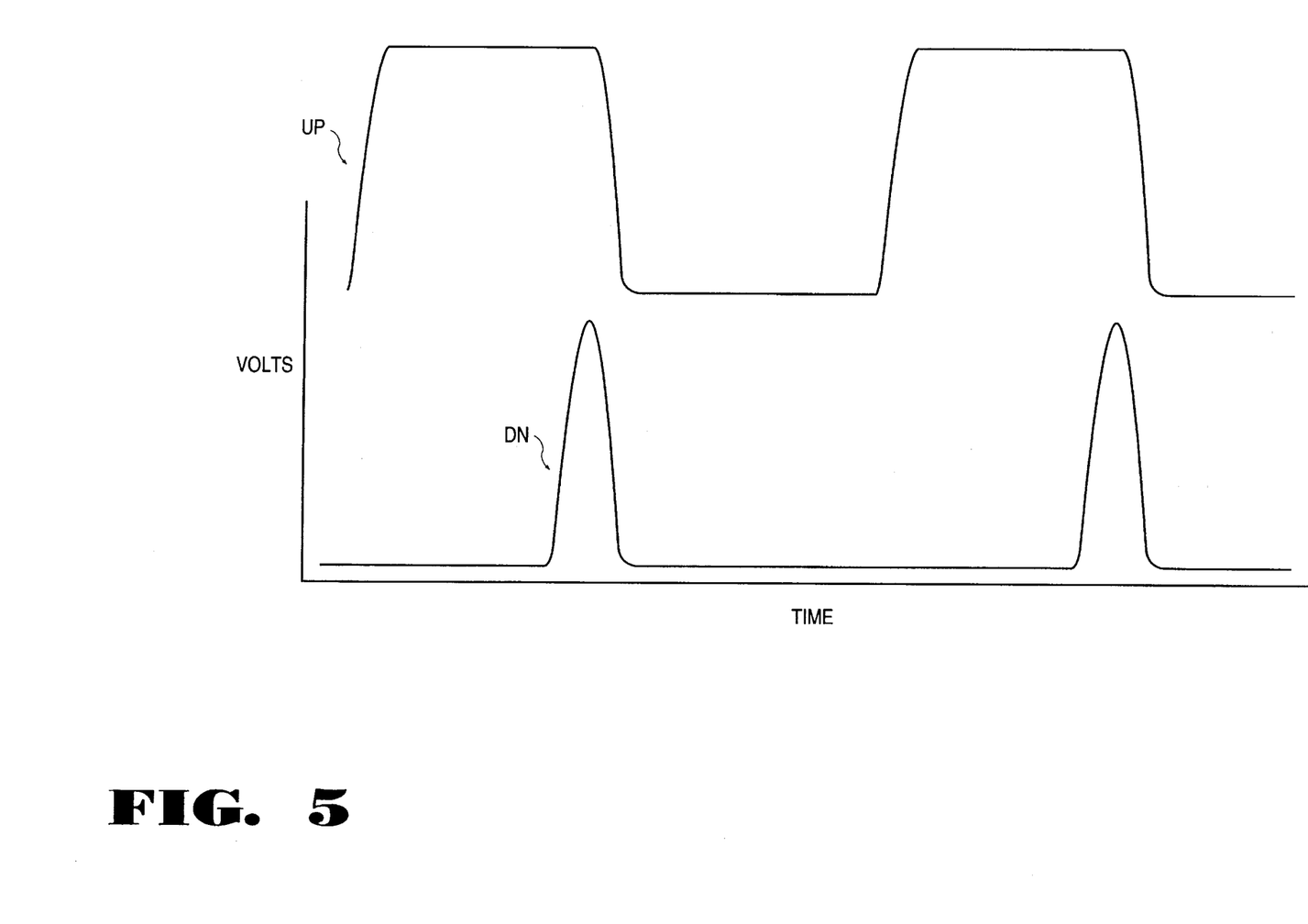
FIG. 5 shows up and down pulses for controlling operation of the source-switched charge pump circuit shown in FIG. 4.
Figure 6:
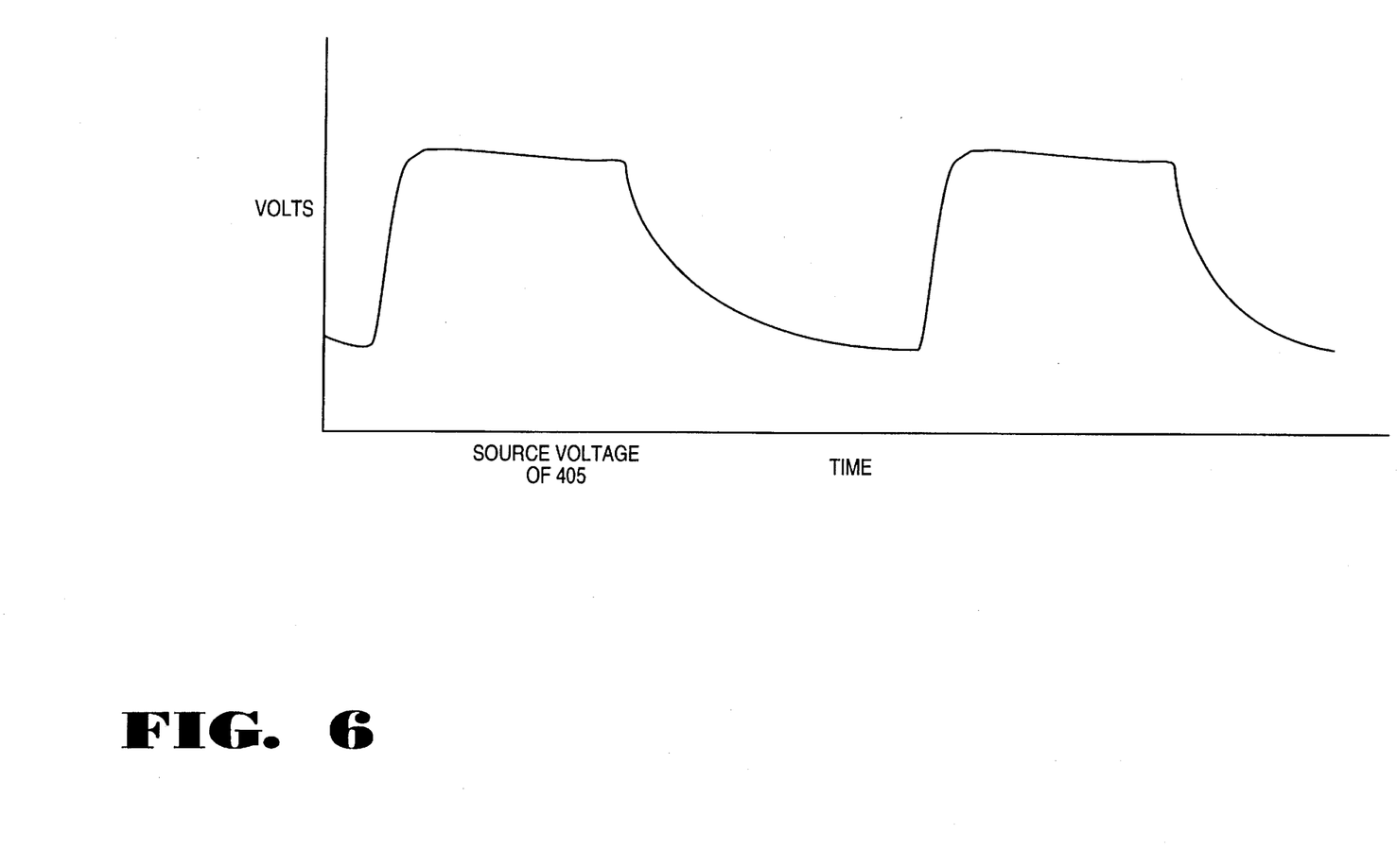
FIG. 6 shows operation of the source-switched charge pump circuit shown in FIG. 4 in response to the up and down pulses shown in FIG. 5.

FIG. 5 shows up pulses and down pulses that are applied to complementary switches 420 and 425. FIG. 6 shows the voltage at the source of charging transistor 405 in response to the up pulses, and FIG. 7 shows the voltage at the source of discharging transistor 410 in response to the down pulses.

FIG. 6 shows that the voltage at the source of charging transistor 405 increases to a maximum level when the UP signal is asserted high, which occurs when an up pulse is applied to complementary switch 420. When the up pulse is removed, the source voltage of charging transistor 405 falls to a minimum value, at which time the up pulse is received again. The swing between the maximum and minimum values at the source of charging transistor 405 is approximately 250 mV according to one embodiment. The behavior at the source of charging transistor 405 is a result of channel charge bleeding away from the channel via the drain of charging transistor 405, and the pace at which charge is transferred from the channel of the charging transistor 405 is determined by the RC time constant of the channel for the charging transistor.

Figure 7:
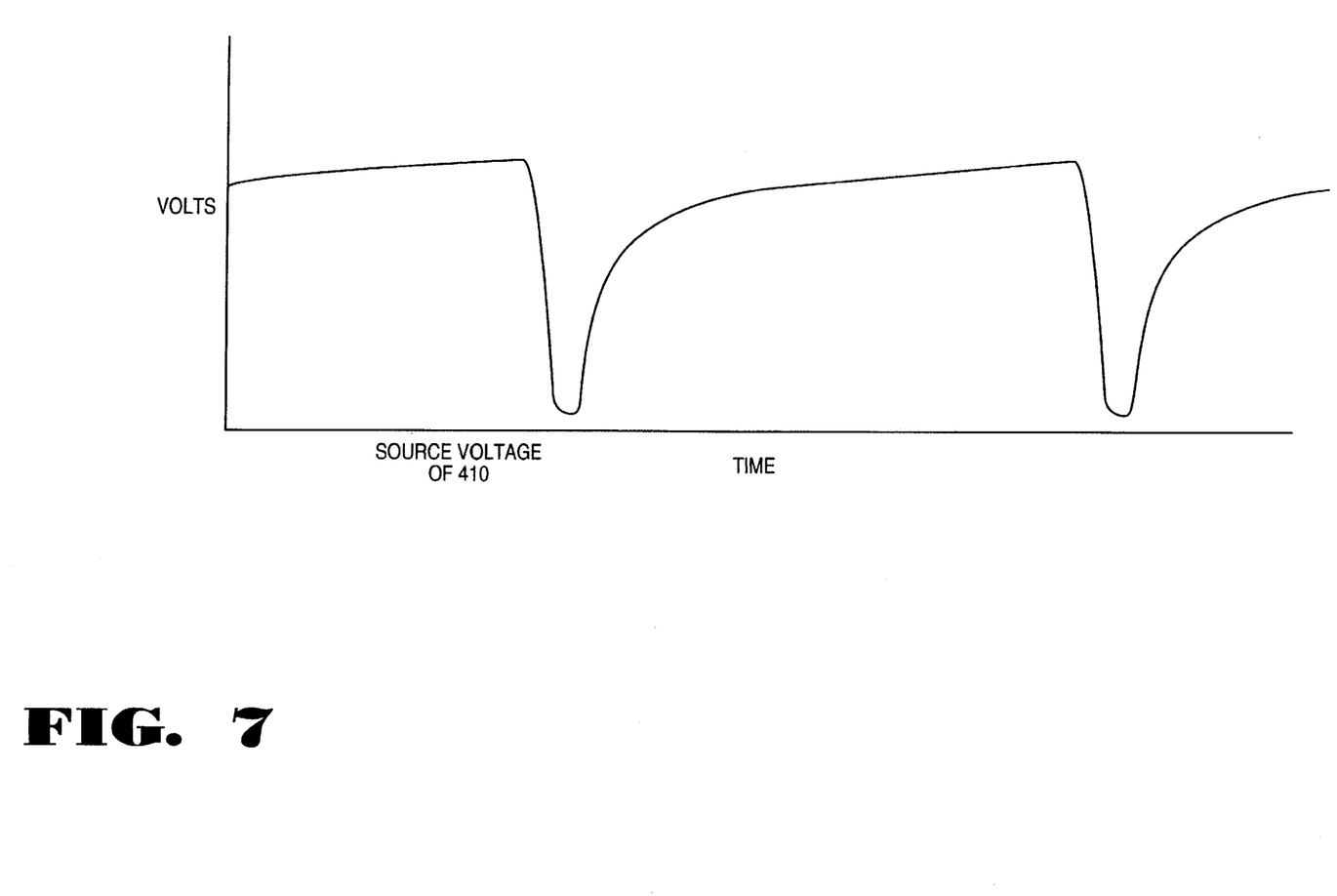
FIG. 7 shows operation of the source-switched charge pump circuit shown in FIG. 4 in response to the up and down pulses shown in FIG. 5.

FIG. 7 shows that the voltage at the source of discharging transistor 410 acts in a similar manner. When the down pulse is applied to complementary switch 425, the voltage at the source of discharging transistor 410 is pulled to a minimum value. The swing between the maximum and minimum values at the source of discharging transistor 410 is approximately 260 mV according to one embodiment. When the down pulse is removed, the voltage at the source of discharging transistor 410 rises towards a maximum value, at which time the down pulse is asserted again. The source voltage of the discharging transistor 410 rises in response to channel charge that has been transferred from the channel of charging transistor 405 to the channel of the discharging transistor 410. The rate of charging the channel of discharging transistor 410 is determined by the RC time constant for the channel of discharging transistor 410.

As shown in FIGS. 6 and 7, the waveforms at the sources of the charging and discharging transistors are not very square. This is due, in part, to the fact that the charging and discharging transistors never fully turn off. When complementary switch 420 is switched off channel charge of charging transistor 405 bleeds from the drain of charging transistor 405 to the drain of discharging transistor 410, reducing the source voltage of charging transistor 405. Because the gate voltages of charging transistor 405 is fixed by the bias circuit 415, the source voltage moved toward turning charging transistor 405 off. The action of channel charge bleeding from the charging transistor 405 to the discharging transistor 410 also serves to raise the source voltage of discharging transistor 410 when complementary switch 425 is switched off such that discharging transistor 410 moves towards switch-off.

The process of moving towards switch off for the charging and discharging transistors happens quite slowly and at different rates for the NMOS and PMOS transistors. When complementary switch 420 switches on, the low impedance supply rail VCC provides a quick current spike that allows the charging transistor 405 to turn on rapidly. Similarly, when complementary switch 425 is switched on, a quick spike of current allows the discharging transistor 410 to turn on rapidly. As shown in FIGS. 6 and 7, the voltage swing on the sources of the charging and discharging transistors is not very great because the charging and discharging transistors are never fully turned off, and a small amount of charge is maintained in the channel of the charging and discharging transistors.

The discharging "tail" at the source of charging transistor 405 when complementary switch 420 is switched off and the charging "tail" at the source of discharging transistor 410 when complementary switch 425 is switched off do not unduly limit the range of PLL lock frequencies over which source-switched charge pump 400 may operate. So long as the period of the lock frequency is at least two to three times greater than the RC time constants of the charging and discharging transistors, an averaging takes place such that there is no net current or corresponding frequency-dependent DC phase error. As described below, there may be some non-zero constant DC phase error associated with the behavior of the charging and discharging transistors. When the period of the lock frequency grows shorter, distortion effects may be observed, but such distortion effects can be controlled by properly sizing the charging transistor 405 and the discharging transistor 410. For example shorter channel lengths and smaller devices should be used so that the time constant of the tails can be controlled to achieve faster settling.

When matched charging and discharging transistors are used, the RC time constants of the charging and discharging transistors are different, resulting in mismatched turn-off times for the charging and discharging transistors. If the RC time constant is small with respect to the clock-period, the average current due to mismatch in turn-off times is small and has a small effect on the overall performance of the source switched charge pump 400. However, if the time constants are a significant portion of the clock-period, the current becomes a function of the clock of input clock frequency, which can result in a net output current for the source-switched charge pump 400 during lock. This output current may vary with external clock frequency, which may result in a DC phase error that is frequency dependent. Thus, the ability to maintain a zero phase error at higher frequencies is limited by the device sizes of the charging and discharging transistors.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A charge pump circuit comprising:
   a charging transistor having a gate coupled to receive a first biasing voltage, the charging transistor being a p-channel field effect transistor (FET);
   a discharging transistor having a gate coupled to receive a second biasing voltage, wherein a drain of the discharging transistor is coupled to a drain of the charging transistor, the discharging transistor being an n-channel FET wherein the charging transistor and the discharging transistor are matched devices;

a first complementary switch coupled in series between a source of the charging transistor and a first supply voltage, the first complementary switch being switched on and off in response to a first pair of complementary signals;

a second complementary switch coupled in series between a source of the discharging transistor and a second supply voltage, the second complementary switch being switched on and off in response to a second pair of complementary signals;

a biasing circuit, providing the first and second biasing voltages, comprising:
  a current source outputting a reference current;
  a current mirror circuit coupled to the current source and the charging and discharging transistors such that the reference current is mirrored to the charging and discharging transistors;
  the current mirror circuit comprising:
    a first field effect transistor (FET), having matched characteristics to the charging transistor, having a source, a drain, and a gate, wherein the drain of the first FET is coupled to the gate of the first FET, the current source being coupled between the drain of the first FET and the second supply voltage;
    a first impedance coupled between the first supply voltage and the source of the first FET, the first impedance being a complementary switch that matches the characteristics of the first complementary switch and being equivalent to a first switch impedance of the first complementary switch when the first complementary switch is switched on;
    a second FET, having matched characteristics to the charging transistor, having a source, a drain, and a gate, wherein the gate of the second FET are coupled to the gate of the first FET and a gate of the charging transistor;
    a second impedance coupled between the first supply voltage and the source of the second FET, the second impedance being a complementary switch that matches the characteristics of the first complementary switch and being equivalent to the first switch impedance of the first complementary switch when the first complementary switch is switched on;
    a third FET having matched characteristics to the discharging transistor, having a source, a drain, and a gate, wherein the drain of the third FET is coupled to the gate of the third FET, a gate of the discharging transistor, and the drain of the second FET; and
    a third impedance coupled between the second supply voltage and the source of the third FET, the third impedance being a complementary switch that matches the characteristics of the second complementary switch and being equivalent to a second switch impedance of the second complementary switch when the second complementary switch is switched on.

2. A phase-locked loop (PLL) comprising:

a loop filter;

a voltage controlled oscillator (VCO) having an input coupled to the loop filter, the VCO outputting a first signal in response to a voltage of the loop filter;

a phase detector circuit coupled to the first signal and a reference signal;

a charge pump circuit coupled to the phase detector circuit and the loop filter, the charge pump circuit setting the voltage of the loop filter in response to an output of the phase detector, the charge pump circuit comprising:
  a charging transistor having a gate coupled to receive a first biasing voltage, the charging transistor being a p-channel field effect transistor (FET);
  a discharging transistor having a gate coupled to receive a second biasing voltage, wherein a drain of the discharging transistor is coupled to a drain of the charging transistor, the discharging transistor being an n-channel FET, wherein the charging and discharging transistors are matched devices;
  a first complementary switch coupled in series between a source of the charging transistor and a first supply voltage, the first complementary switch being switched on and off in response to a first pair of complementary signals;
  a second complementary switch coupled in series between a source of the discharging transistor and a second supply voltage, the second complementary switch being switched on and off in response to a second pair of complementary signals;
  a biasing circuit, providing the first and second biasing voltages, comprising a current source outputting a reference current and a current mirror circuit coupled to the current source and the charging and discharging transistors such that the reference current is mirrored to the charging and discharging transistors;
  the current mirror circuit comprising:
    a first field effect transistor (FET), having matched characteristics to the charging transistor, having a source, a drain, and a gate, wherein the drain of the first FET is coupled to the gate of the first FET, the current source being coupled between the drain of the first field effect transistor and the second supply voltage;
    a first impedance coupled between the first supply voltage and the source of the first FET, the first impedance being a complementary switch that matches the characteristics of the first complementary switch and being equivalent to a first switch impedance of the first complementary switch when the first complementary switch is switched on;
    a second FET, having matched characteristics to the charging transistor, having a source, a drain, and a gate, wherein the gate of the second FET are coupled to the gate of the first FET and a gate of the charging transistor;
    a second impedance coupled between the first supply voltage and the source of the second FET, the second impedance being a complementary switch that matches the characteristics of the first complementary switch and being equivalent to the first switch impedance of the first complementary switch when the first complementary switch is switched on;
    a third FET, having matched characteristics to the discharging transistor, having a source, a drain, and a gate, wherein the drain of the third FET is coupled to the gate of the third FET, a gate of the discharging transistor, and the drain of the second FET; and a third impedance coupled between the second supply voltage and the source of the third FET, the third impedance being a complementary switch that matches the characteristics of the second complementary switch and being equivalent to a second switch impedance of the second complementary switch when the second complementary switch is switched on.

* * * * *